(12) United States Patent
Rückerl

(10) Patent No.: US 11,075,323 B2
(45) Date of Patent: Jul. 27, 2021

(54) METHOD OF PRODUCING A RADIATION-EMITTING COMPONENT AND RADIATION-EMITTING COMPONENT

(71) Applicant: OSRAM Opto Semiconductors GmbH, Regensburg (DE)

(72) Inventor: Andreas Rückerl, Konzell (DE)

(73) Assignee: OSRAM OLED GmbH, Regensburg (DE)

(*) Notice: Subject to any disclaimer, the term of this patent is extended or adjusted under 35 U.S.C. 154(b) by 336 days.

(21) Appl. No.: 16/305,202

(22) PCT Filed: May 24, 2017

(86) PCT No.: PCT/EP2017/062655
§ 371 (c)(1),
(2) Date: Nov. 28, 2018

(87) PCT Pub. No.: WO2017/207406
PCT Pub. Date: Dec. 7, 2017

(65) Prior Publication Data
US 2020/0287091 A1    Sep. 10, 2020

(30) Foreign Application Priority Data
May 30, 2016   (DE) ............... 10 2016 109 874.4

(51) Int. Cl.
*H01L 33/44* (2010.01)
*H01L 51/52* (2006.01)
(Continued)

(52) U.S. Cl.
CPC .......... *H01L 33/44* (2013.01); *H01L 33/0095* (2013.01); *H01L 33/56* (2013.01);
(Continued)

(58) Field of Classification Search
None
See application file for complete search history.

(56) References Cited

U.S. PATENT DOCUMENTS

| 8,698,396 B2 | 4/2014 | Maindron et al. |
| 2008/0138539 A1* | 6/2008 | Breitung ............ H01L 51/5253 428/1.1 |

(Continued)

FOREIGN PATENT DOCUMENTS

| WO | 2006/014591 A2 | 2/2006 |
| WO | 2009/002892 A1 | 12/2008 |

OTHER PUBLICATIONS

Dameron, A. A. et al., "Gas Diffusion Barriers on Polymers Using Multilayers Fabricated by $Al_2O_3$ and Rapid $SiO_2$ Atomic Layer Deposition," *J Phys. Chem. C*, 2008, vol. 112, No. 12, pp. 4573-4580.

(Continued)

*Primary Examiner* — Nicholas J Tobergte
*Assistant Examiner* — Kien C Ly
(74) *Attorney, Agent, or Firm* — DLA Piper LLP (US)

(57) ABSTRACT

A method of producing a radiation-emitting component includes: A) providing a dielectric layer that degrades against environmental influences; B) applying a first protective layer to the dielectric layer by an atomic layer deposition method, wherein the first protective layer includes elemental Si or in a compound; and C) applying a second protective layer to the first protective layer, the second protective layer including elemental Si, wherein a layer thickness of the first protective layer is less than or equal to 1 nm so that the first protective layer reduces or prevents a degradation of the dielectric layer.

15 Claims, 7 Drawing Sheets

(51) Int. Cl.
*H01L 51/56* (2006.01)
*H01S 5/028* (2006.01)
*H01L 33/56* (2010.01)
*H01L 33/00* (2010.01)

(52) U.S. Cl.
CPC .......... *H01L 51/5253* (2013.01); *H01L 51/56* (2013.01); *H01S 5/0282* (2013.01); *H01L 2251/558* (2013.01); *H01L 2933/0025* (2013.01)

(56) References Cited

U.S. PATENT DOCUMENTS

| | | |
|---|---|---|
| 2011/0168436 A1 | 7/2011 | Simpson |
| 2014/0190565 A1 | 7/2014 | Jung et al. |
| 2015/0221891 A1 | 8/2015 | Ghosh et al. |

OTHER PUBLICATIONS

Rucked, A. et al., "Characterization and prevention of humidity related degradation of atomic layer deposited $Al_2O_3$," *Journal of Applied Physics*, 2017, vol. 121, pp. 025306-1-025306-8.

\* cited by examiner

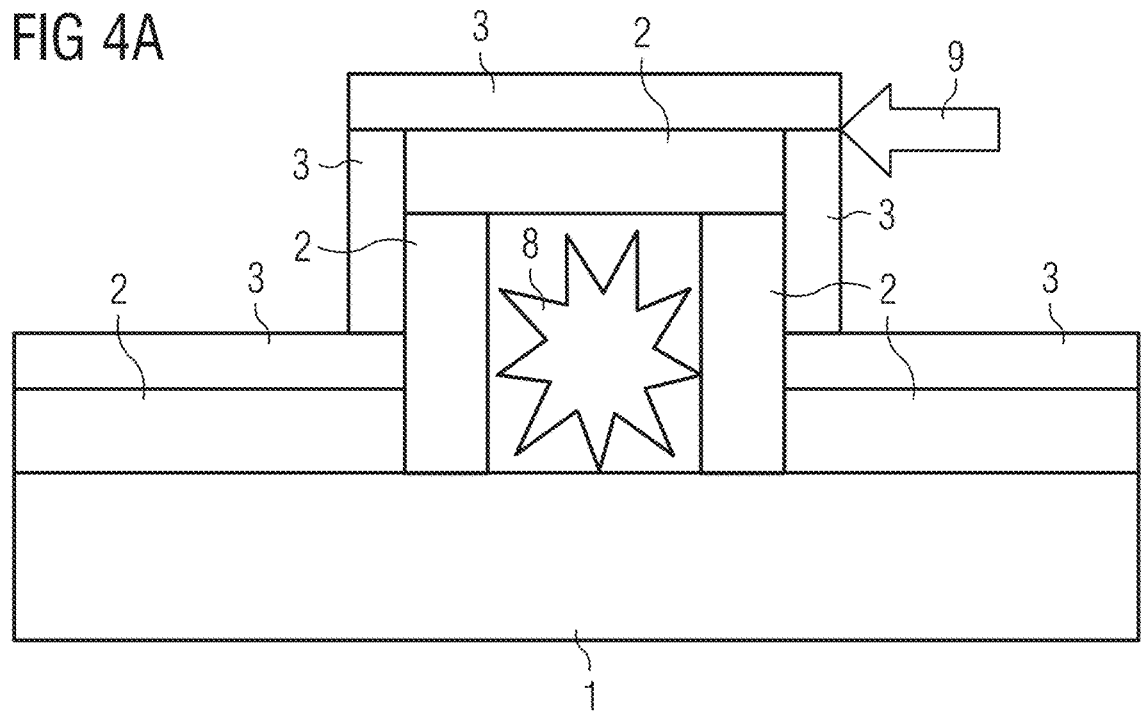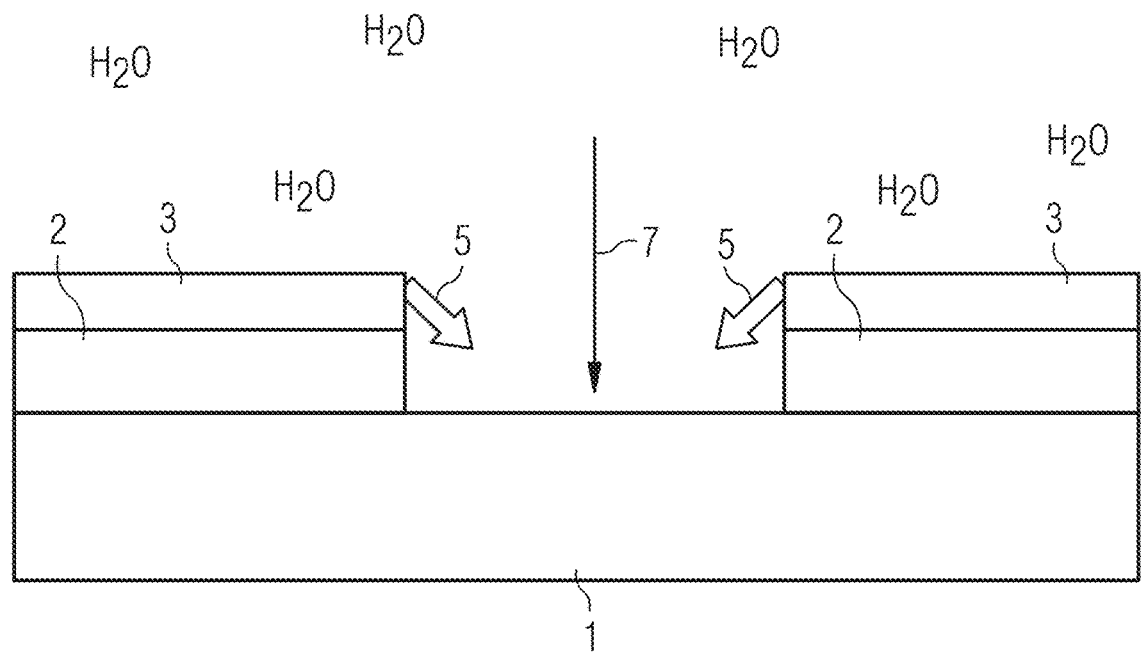

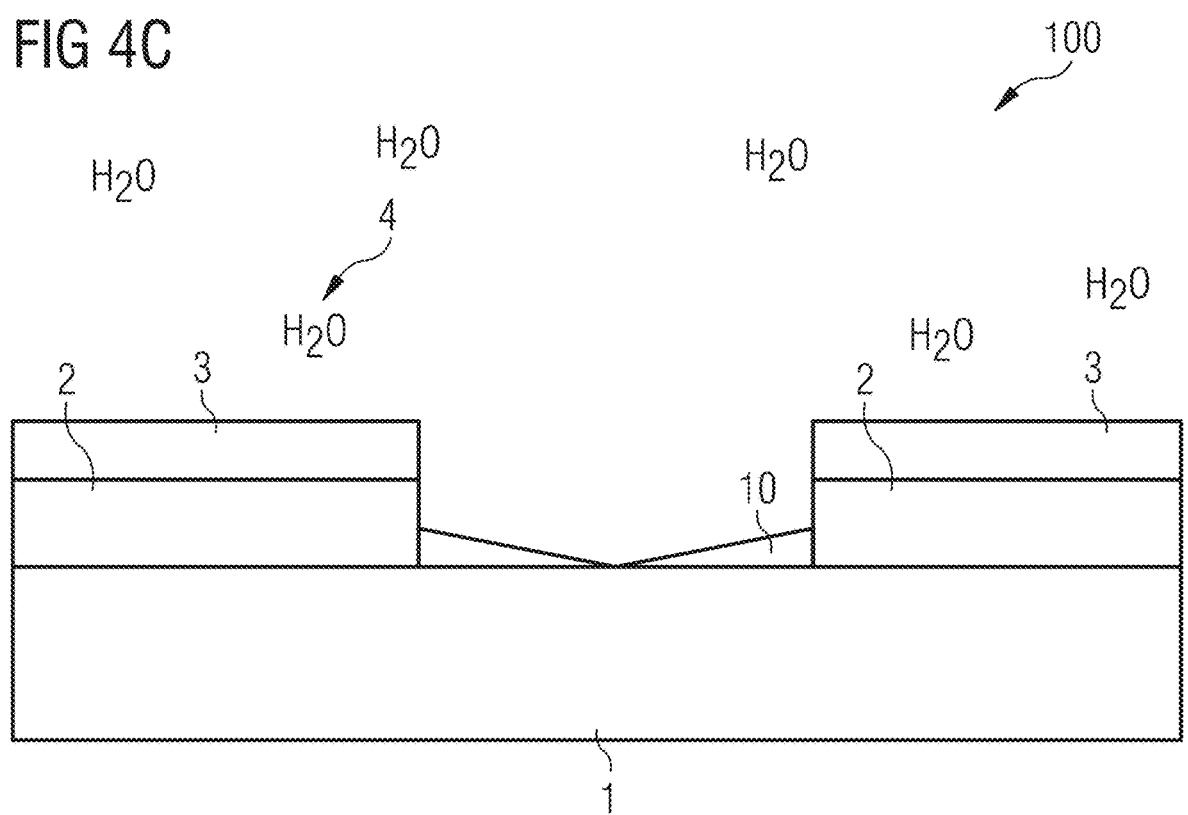

METHOD OF PRODUCING A RADIATION-EMITTING COMPONENT AND RADIATION-EMITTING COMPONENT

TECHNICAL FIELD

This disclosure relates to a method of producing a radiation-emitting component and a radiation-emitting component.

BACKGROUND

Radiation-emitting components such as, for example, inorganic light-emitting diodes, organic light-emitting diodes or lasers, in particular in the automotive sector or when used in an outdoor area must be protected against degradation phenomena triggered by environmental influences. Such degradation phenomena include, for example, silver migration, hydrolysis or reaction with bound sulfur. Radiation-emitting components are protected from the degradation phenomena by the use of optically transparent dielectrics generally having a small value for WVTR (water vapor transmission rate) that prevent water and/or moisture from entering the component. For example, dielectrics made of aluminum oxide can be used. Aluminum oxide has a very small WVTR, is deemed to be "pinhole"-free and can be produced with the aid of, for example, the atomic layer deposition method (ALD) in nearly each geometry.

However, most dielectrics such as aluminum oxide, age in the presence of environmental influences such as, for example, humidity and/or heat stress. Aluminum hydroxide is formed. The protective effect of the dielectrics such as aluminum oxide, for example, is lost so that moisture can enter the radiation-emitting component and thus degradation of the aluminum oxide can lead to destruction of the radiation-emitting component.

It could therefore be helpful to provide a method of producing a radiation-emitting component that produces a stable radiation-emitting component and a stable radiation-emitting component that is in particular stable against environmental influences.

SUMMARY

I provide a method of producing a radiation-emitting component including:
A) providing a dielectric layer that degrades against environmental influences,
B) applying a first protective layer to the dielectric layer by an atomic layer deposition method, wherein the first protective layer includes elemental Si or in a compound, and
C) applying a second protective layer to the first protective layer, the second protective layer including elemental Si, wherein a layer thickness of the first protective layer is less than or equal to 1 nm so that the first protective layer reduces or prevents a degradation of the dielectric layer.

I also provide a radiation-emitting component including a dielectric layer including aluminum oxide, and a first protective layer arranged on the dielectric layer and configured to encapsulate the dielectric layer against environmental influences, wherein at least one of the dielectric layer and the first protective layer is produced by an atomic layer deposition method, the first protective layer includes elemental Si or in a compound, a layer thickness of the first protective layer is less than or equal to 1 nm so that the first protective layer reduces or prevents a degradation of the dielectric layer, and a second protective layer is applied to the first protective layer and the second protective layer includes elemental Si.

I further provide a method of producing a radiation-emitting component including:
A) providing a dielectric layer that degrades against environmental influences, and
B) applying a first protective layer to the dielectric layer by an atomic layer deposition method, wherein the first protective layer includes elemental Si or in a compound, and a layer thickness of the first protective layer is less than or equal to 1 nm so that the first protective layer reduces or prevents degradation of the dielectric layer.

BRIEF DESCRIPTION OF THE DRAWINGS

FIGS. 4A to 4C show a method of producing a radiation-emitting component.

LIST OF REFERENCE SIGNS

Figure 1:
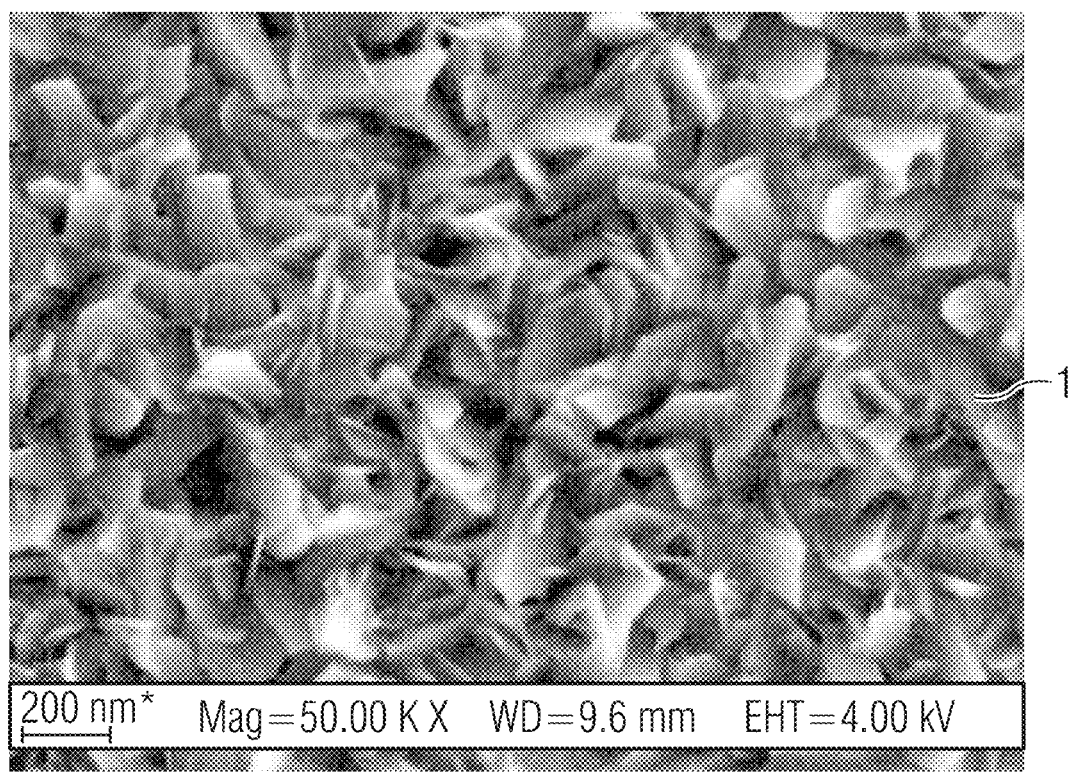
FIG. 1 shows a scanning electron micrograph of a comparative example.

100 radiation-emitting component
1 dielectric layer
2 first protective layer
3 second protective layer
4 environmental influences
5 creep/diffusion
6 damage
7 exposed surface of the dielectric layer
8 particles
9 force
10 healing
12 crystals

DETAILED DESCRIPTION

My method of producing a radiation-emitting component or a component may comprise the following steps:
A) providing a dielectric layer degraded or degradable by environmental influences, which in particular can naturally suffer from degradation phenomena under certain environmental influences such as, for example, $Al_2O_3$,
B) applying a first protective layer to the dielectric layer by atomic layer deposition methods, wherein the first protective layer comprises elemental silicon and/or silicon in a compound, and the layer thickness of the first protective layer is less than or equal to 1 nm so that the first protective layer reduces and/or prevents a degradation of the dielectric layer. In particular, the first protective layer prevents degradation of the dielectric layer.

My radiation-emitting components may have a dielectric layer comprising aluminum. Furthermore, the radiation-emitting component has a first protective layer arranged on the dielectric layer that encapsulates the dielectric layer against environmental influences. The dielectric layer and/or the first protective layer is or are produced by atomic layer deposition methods. The first protective layer comprises elemental silicon and/or silicon in a compound or consists of these materials. The layer thickness of the first protective layer is less than or equal to 1 nm and the first protective layer reduces and/or prevents degradation of the dielectric layer.

Further advantages of the method and of the radiation-emitting component are specified and apply both to the method and the radiation-emitting component.

The radiation-emitting component may be an inorganic light-emitting diode (LED), an organic light-emitting diode (OLED) or a laser. The radiation-emitting component comprises in particular a semiconductor chip. The semiconductor chip preferably emits blue light, white light, yellow light, green light, orange-colored light and/or red light.

In the radiation-emitting component, the semiconductor chip may have a semiconductor layer sequence. The semiconductor layer sequence of the semiconductor chip is preferably based on a III-V compound semiconductor material. The semiconductor material is preferably a nitride compound semiconductor material such as $Al_nIn_{1-n-m}Ga_mN$, or else a phosphide compound semiconductor material such as $Al_nIn_{1-n-m}Ga_mP$, whereas each of $0 \leq n \leq 1$, $0 \leq m \leq 1$ and $n+m \leq 1$ respectively apply. The semiconductor material can likewise be $Al_xGa_{1-x}As$ whereby $0 \leq x \leq 1$ applies. The semiconductor layer sequence can have dopants and additional constituents. For the sake of simplicity, however, only the essential components of the crystal lattice of the semiconductor layer sequence are mentioned, that is Al, As, Ga, In, N or P, even if they can be partially replaced and/or supplemented by small quantities of further substances.

The semiconductor layer sequence comprises an active layer having at least one pn junction and/or having one or more quantum well structures. During operation of the semiconductor chip, an electromagnetic radiation is generated in the active layer. A wavelength of the radiation lies preferably in the ultraviolet, infrared and/or visible spectral range, in particular at wavelengths of 420 nm to 680 nm, for example, 440 nm to 480 nm.

The method may comprise a step A), providing a dielectric layer degraded or degradable against environmental influences.

The dielectric layer may comprise aluminum. Aluminum can preferably be present in a compound, for example, as an aluminum oxide ($Al_2O_3$).

The dielectric layer may comprise aluminum oxide or consist thereof and is produced by atomic layer deposition methods.

Environmental influences are referred to in particular as physical, chemical or other effects on the radiation-emitting component that can lead to degradation phenomena of the component. In particular, environmental influences mean silver migration, hydrolysis and/or the influence of moisture and/or of heat.

The method may comprise a step B), applying a first protective layer to the dielectric layer by atomic layer deposition methods. The atomic layer deposition method (ALD) is sufficiently known to those skilled in the art and is therefore not explained in more detail. Instead of the ALDs, the MLD method (molecule layer deposition) can also be used.

That a layer or an element is arranged or applied "on" or "over" another layer or another element can mean that the one layer or the one element is arranged directly in direct mechanical and/or electrical contact on the other layer or the other element. Furthermore, this can also mean that the one layer or the one element is arranged indirectly on or above the other layer or the other element. In this case, further layers and/or elements can then be arranged between the one and the other layer or between the one and the other element.

The first protective layer is preferably applied directly to the dielectric layer. Direct mechanical contact means that no further layers or elements are present between the first protective layer and the dielectric layer.

The dielectric layer may have aluminum in a compound, for example, aluminum oxide or comprise it and, according to step B), forms a covalent bond to the first protective layer. The formed covalent bond of the first protective layer preferably comprises the covalent bond Al—O—Si at the interface.

The formed covalent bond of the first protective layer preferably has the covalent bond Al[—O—Si-]n. In particular, n=1, that is the first protective layer is formed as a monolayer. Alternatively, n=2, 3, 4, 5, 6, 7, 8 or 9. Adjacent Si atoms can cross-link such that Si—O—Si is intermediately cross-linked transversely to the surface.

The layer thickness of the first protective layer may be less than or equal to 1 nm, 0.9 nm, 0.8 nm, 0.7 nm, 0.5 nm, 0.4 nm, 0.3 nm, 0.2 nm, 0.1 nm or 0.05 nm so that the first protective layer reduces or prevents degradation of the dielectric layer. Particularly preferably, the layer thickness of the first protective layer is exactly one monolayer or exactly two monolayers or exactly three monolayers.

The first protective layer may comprise elemental silicon. Alternatively or additionally, the first protective layer comprises or consists of silicon in a compound. Silicon in a compound means that the silicon is bound to another element of the periodic system, for example, to oxygen, and thus forms silicon oxide, for example. Silicon oxide refers to all oxides of silicon, wherein the stoichiometric composition can be variable. Silicon dioxide ($SiO_2$) is preferably designated with silicon oxide.

In other words, the first protective layer encapsulates the dielectric layer such that environmental influences cannot or only slightly reach the dielectric layer and can lead to aging or degradation of the dielectric layer.

The first protective layer may comprise elemental silicon or consist thereof. In the event of damage to the first protective layer, the dielectric layer can thus be exposed. The first protective layer heals the damage in a self-healing manner so that the dielectric layer is passivated with respect to environmental influences. Self-healing means that this healing takes place without tools or without additional (external) process steps.

The healing may be carried out by chemical reaction of the silicon of the first protective layer to form silicic acid or derivatives thereof and subsequently by the covalent bonding of the silicic acid to the dielectric layer according to the structural formula Al—O—Si, in particular Al—O—Si(OH)$_3$. The silicic acids can cross-link with one another with separation of water.

The following reactions can take place alone or in combination in or on the radiation-emitting component:
1) aging of ALD-Al$_2$O$_3$

ALD-Al$_2$O$_3$+H$_2$O→2AlOOH (→ unwanted reaction)

In principle, other aging products such as Al(OH)$_3$ can also be produced.
2) dissociation of water

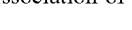

H$_2$O→H$^+$+OH$^-$ 3) basicity of a hydroxylated ALD-Al$_2$O$_3$ surface

Al*—OH+H$^+$→Al*—OH$_2^+$

The * indicates that it is a surface group of the ALD-Al$_2$O$_3$.
4) etching silicon to form silicic acid residues $$Si + 2OH^- + 2H_2O \rightarrow [SiO_2(OH)_2]^{2-} + 2H_2$$

5) decomposition of SiO$_2$ 4 formation of silicic acid $$SiO_2 + 2H_2O \rightarrow Si(OH)_4$$

6) reaction of silicic acid residues with ALD-Al$_2$O$_3$ surface groups $$[SiO_2(OH)_2]^{2-} + Al^*\!-\!OH_2^+ \rightarrow Al^*\!-\!O\!-\!SiO(OH)_2^- + H_2O$$

These bound silicic acid residues can then cross-link on the surface with formation of Si—O—Si bonds and separation of water or OH cross-links.
7) additional condensation reactions are possible between:
a) OH groups of silicic acids; the covalent bond Si—O—Si can be formed in a silicic acid dimer+H$_2$O.

$$Si(OH)_4 + Si(OH)_4 \rightarrow {}_3(HO)\!-\!Si\!-\!O\!-\!Si(OH)_3$$

In addition to dimers, longer and cross-linked silicic acid condensates can also be produced, even if the result is hardly to be expected because of the low silicic acid reactions.
b) OH group and O$^-$ of silicic acid(-residues)→the covalent bond "Si—O—Si"+OH$^-$ can form, wherein the reaction is similar to the reaction between two silicas, only the OH$^-$ can be formed.
c) between OH groups of silica and Al*—OH groups→"Al—O—Si"+H$_2$O results $$[Si(OH)_4] + Al^*\!-\!OH \rightarrow Al^*\!-\!O\!-\!Si(OH)_3 + H_2O$$

These bound silicic acids can then cross-link on the surface with formation of Si—O—Si bonds and separation of water.
and/or
d) between O$^-$ groups of silicic acid residues and Al*—OH groups→"Al—O—Si"+OH$^-$ results $$[SiO_2(OH)_2]^{2-} + Al^*\!-\!OH \rightarrow Al^*\!-\!O\!-\!SiO(OH)_2^- + OH^-$$

The first protective layer may cover the dielectric layer in a form-fitting manner. In other words, the first protective layer envelops the dielectric layer such that no environmental influences can reach the dielectric layer.

The first protective layer may comprise silicon oxide, in particular silicon dioxide, wherein the first protective layer covers the dielectric layer in a form-fitting manner.

The method may comprise an additional step:
C) applying a second protective layer to the first protective layer, wherein the second protective layer comprises or consists of elemental silicon.

The second protective layer may have a layer thickness of at most 3 nm, 2 nm, 1.5 nm, 1 nm, 0.8 nm or 0.6 nm, for example, a layer thickness of 1 nm+/−0.2 nm.

The second protective layer may be applied in a structured manner. "Structured" means that the second protective layer, in particular onto the first protective layer, is applied such that the second protective layer, at least the dielectric layer and/or the first protective layer is/are not covered in a form-fitting manner. In the event of damage to the first protective layer and/or the dielectric layer, the second protective layer can automatically heal or passivate the damage to the first protective layer and/or the dielectric layer, that is without the action of a tool, a person or further process steps. In other words, the second protective layer, which comprises silicon, or the first protective layer, if the latter comprises silicon, perform a so-called self-healing process. This self-healing process automatically closes possible faults in the first protective layer or in the dielectric layer such as pinholes, nanoslits, scratches or process errors, if the radiation-emitting component is exposed to a degrading environment, that is to say environmental influences. A passivation is carried out. This can also be referred to as a wound healing process. Thus, the second protective layer or the first protective layer comprising silicon has a very strong so-called distance effect, as a result of which larger defects can also be automatically passivated.

The healing may be carried out by chemical reaction of the Si of the second protective layer to form silicic acid and/or derivatives thereof and subsequently to form a covalent bonding of the silicic acid to the dielectric layer according to the structural formula Al—O—Si.

The second protective layer and the damage may have a distance of at least 1 µm and at most 200 µm, preferably a distance of at least 50 µm and at most 100 µm or 200 µm, for example, 75 µm. During healing, the second protective layer can diffuse in the direction of the damage and passivate the dielectric layer. The damage can be generated, for example, during the deposition process of the passivation, or subsequently, and can be annealed in particular in the event of environmental influences or a degrading environment.

I found that the first protective layer and/or the second protective layer can chemically suppress the actual ageing process of the dielectric layer, in particular of aluminum oxide, in a degrading environment by chemically terminating the dielectric layer in an ageing-resistant manner. Thus, not only environmental influences such as water, are physically kept away from the dielectric layer, but a chemical reaction of the environmental influences with the dielectric layer is also suppressed.

The first protective layer and/or the second protective layer can be made very thin, for example, they can each be only one monolayer thick. The protective layers are therefore thinner and more effectively formed compared to conventional protective layers. This also saves material and process steps.

In addition, the dielectric layer is chemically stabilized by at least one of the protective layers, in particular at the surface of the dielectric layer. This can be achieved by atomic layer deposition methods and deformation or overshaping problems can thereby be avoided.

In addition, the protective layers themselves can induce a self-healing process, in particular if the protective layers comprise elemental silicon. In the event of an error, the defects of the dielectric layer are self-passivated by the protective layer, when the radiation-emitting component is exposed to an aging environment, in particular a degrading environment.

In comparison thereto, in conventional components, the protective layers have to be formed to be very thick since the latter mainly form a physical barrier against environmental influences and a penetration of environmental influences has to be avoided. In addition, pinholes or overforming defects of the aluminum oxide of the dielectric layer can be avoided with a thick protective layer. The conventional protective layers are applied, for example, by PECVD (plasma enhanced chemical vapor deposition). However, protective layers of this type have an at least 6 times greater than, or an at least equal layer thickness to, the dielectric layer (for example, a dielectric layer of 45 nm and a protective layer of 350 nm). In comparison thereto, my protective layers are very thin, that is to say thinner than the dielectric layer, in particular in the sub-nanometer range, and nevertheless protect against degradation of the dielectric layer.

The layers produced by PECVD can overform unevenness only with great difficulty. For this reason, cavities can be formed on overforming edges with high aspect ratios, which cannot be closed even by a high layer thickness.

On the other hand, dielectric layers must be buried so deep under the conventional protective layer that any particles on a semiconductor chip of a radiation-emitting component cannot flake off in the subsequent process since this would lead to failure of the protective layer.

Further advantages and developments result from the examples described below in conjunction with the figures.

In the examples and figures, identical, similar or identically acting elements can each be provided with the same reference signs. The elements illustrated and their size relationships among one another are not to be regarded as true to scale. Rather, individual elements such as, for example, layers, elements, components and regions are represented with an exaggerated size for better representability and/or for better understanding.

FIG. 1 shows a scanning electron microscope (SEM) image of a degraded dielectric layer 1 comprising aluminum oxide and which has been exposed to environmental influences. The aluminum oxide reacted, for example, with water to form aluminum oxide hydroxide. The aluminum oxide surface was produced by atomic layer deposition methods. To avoid this degraded effect, the dielectric layer 1 should be protected from degradation by a protective layer 2, 3.

Figure 2A:
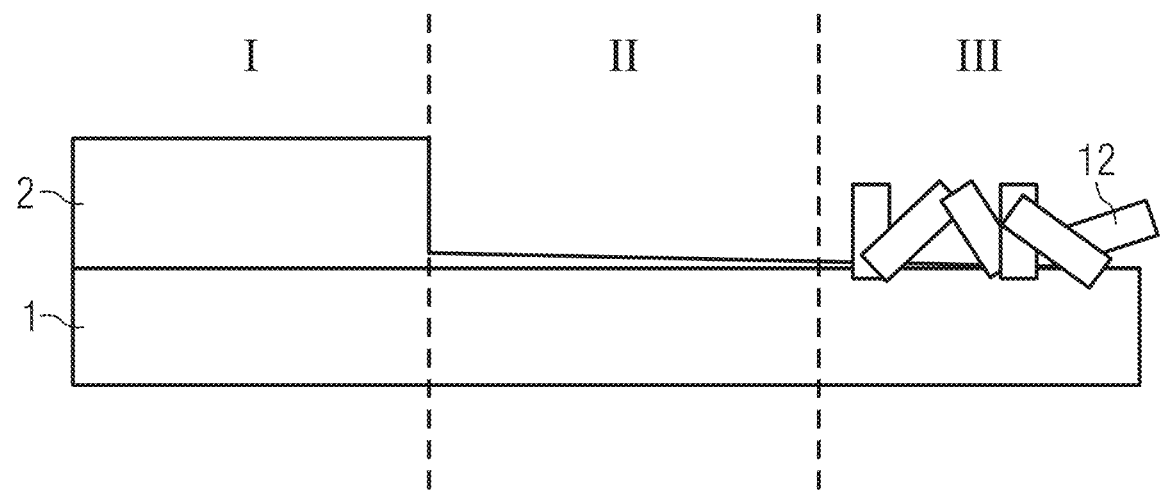
FIG. 2A shows a radiation-emitting component according to an example and a comparative example.
Figure 2B:
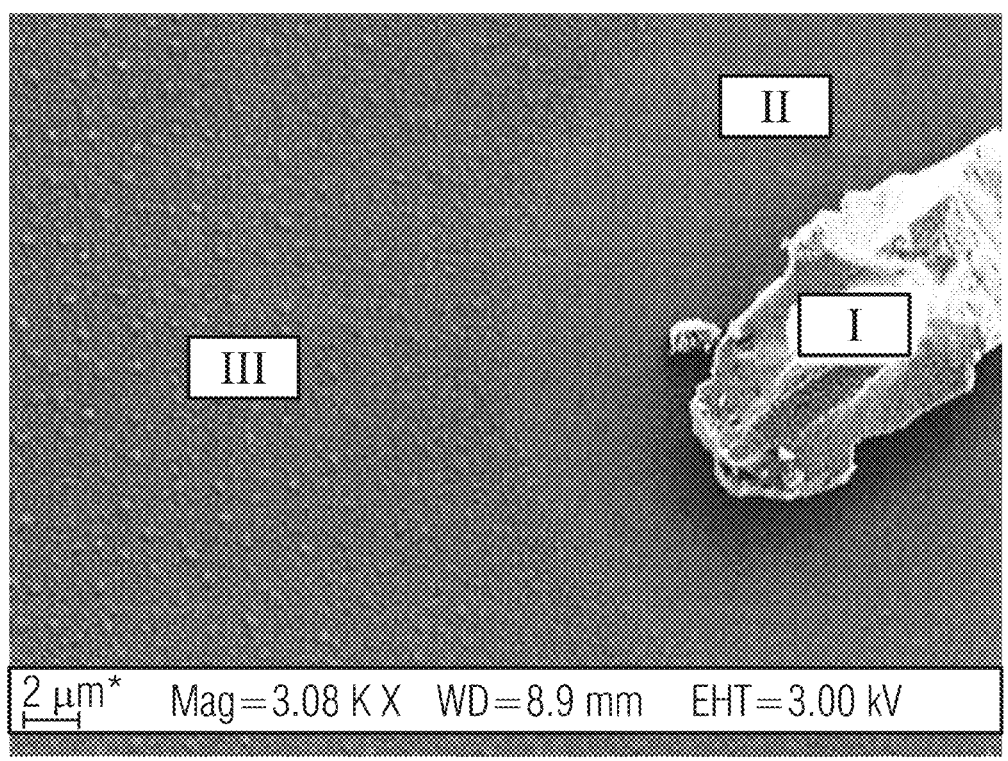
FIG. 2B shows a scanning electron micrograph.

FIGS. 2A and 2B show a radiation-emitting component and a scanning electron micrograph. The so-called chemical capping theory is shown. The radiation-emitting component of FIG. 2A shows a dielectric layer 1 formed in particular from aluminum oxide by atomic layer deposition methods. In the region of I, a first protective layer 2 is arranged on the dielectric layer 1. The first protective layer 2 is formed in particular from silicon. A silicon source is thus made available. The associated scanning electron micrograph in FIG. 2B shows the surface of the dielectric layer 1 and the protective layer 2 in the region of I. In the region of II, the first protective layer 2, in particular the silicon of the first protective layer 2 or silicon in the form of the silicic acid, diffuses to the surface of the aluminum oxide and forms silicic acid, in particular monosilicic acid, and subsequently forms a silicon oxide film, in particular a silicon dioxide film. In particular, the silicon is converted at its original location to silicic acid and then diffuses onto the surface of the aluminum oxide. A covalent bonding of the monosilicic acids to the dielectric layer can take place so that the structural unit Al—O—Si is obtained as a surface termination. The Si residues can then further cross-link to one another to form Si—O—Si bonds with separation of water. In particular, additional condensation reactions can be possible, for example, between the OH groups of the silicic acid so that structural units such as Si—O—Si and water can be formed. Furthermore, the OH groups and the O⁻ groups of the silicic acid or silicic acid residues can give rise to an Si—O—Si unit or bond and to hydroxide ions, or Al—O—Si bonds and water can be formed between the OH groups of the silicic acid and the Al*—OH groups. Alternatively, an Al—O—Si bond and hydroxide ions can also be formed between the oxygen groups of the silicic acid residues and the Al*—OH groups.

The zone III of FIG. 2A shows degradation of the surface of the dielectric layer 1, in particular degradation of the aluminum oxide produced by atomic layer deposition processes. Crystallization of the aluminum oxide is observed on the basis of a hydroxylation reaction. The associated SEM image is shown in FIG. 2B.

It can be seen from FIG. 2B that no aging has taken place around the first protective layer 2 (region I), while aging of the dielectric layer 1 occurred outside the range of action.

Alternatively, it is possible to use the self-activated silicon-induced capping mechanism or the ALD $Al_2O_3$ termination in a singular manner or in combination with other possibly already present encapsulations.

Figure 3A:
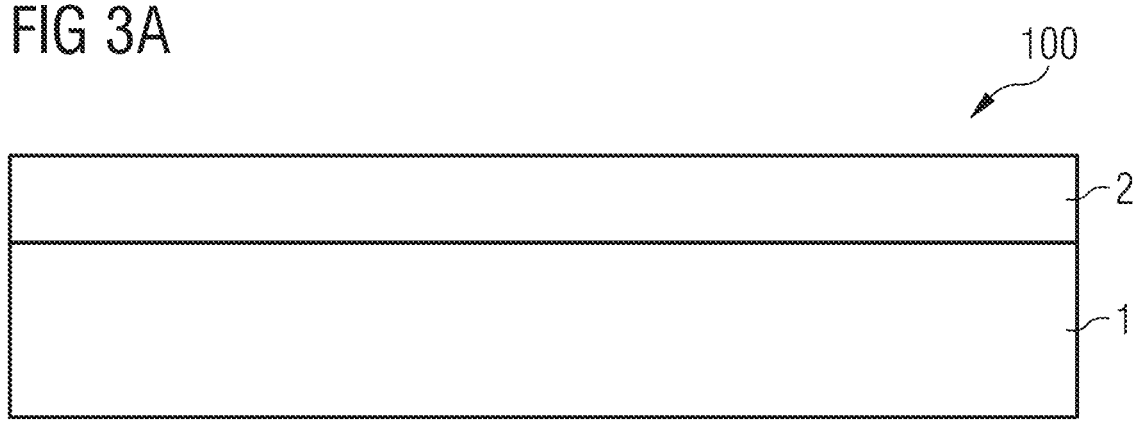
FIGS. 3A to 3C each show a radiation-emitting component according to an example.
Figure 3B:
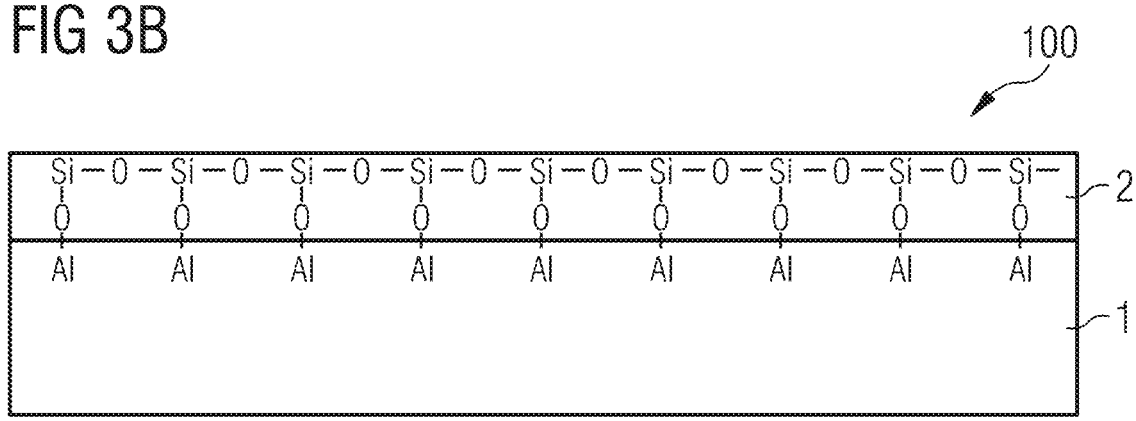
Figure 3C:
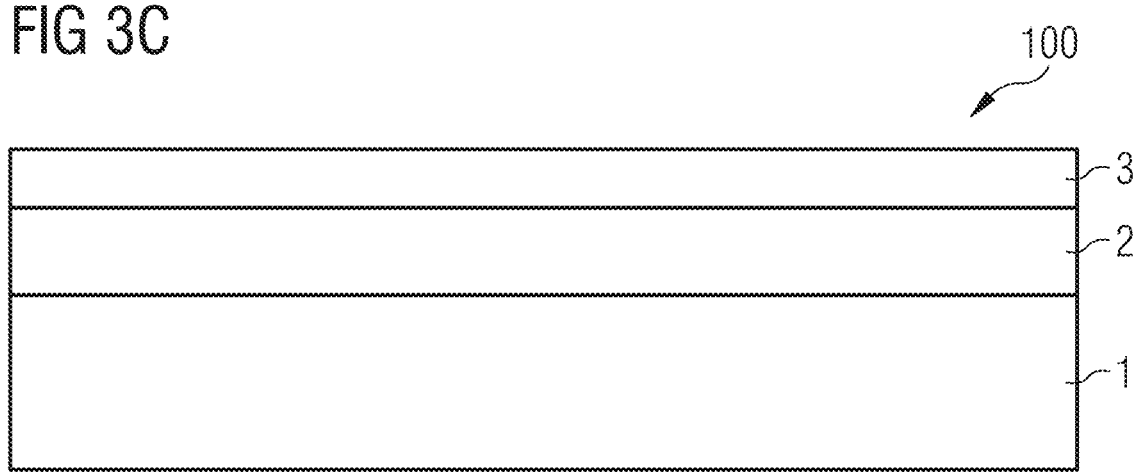

FIGS. 3A to 3C each show a radiation-emitting component 100 according to an example. FIG. 3A shows a radiation-emitting component 100 having a dielectric layer 1 and a first protective layer 2 arranged directly thereon. The dielectric layer 1 is formed in particular from aluminum oxide produced by atomic layer deposition methods. The first protective layer 2 is formed in particular from elementary silicon or from silicon in a compound, for example, from silicon oxide. Preferably, the silicon is also applied to the dielectric layer 1 in an elementary manner or in a compound manner by atomic layer deposition methods. In this way, it is advantageously possible to use only one installation to deposit both layers.

The first and/or second protective layer 2, 3 can be part of an encapsulation or used for the passivation of p and/or n semiconductor layers.

The first protective layer can be used to protect the semiconductor chip surface, for example, the surface of the n-type semiconductor layer of the semiconductor chip, the mesa edge with a pn junction, within the semiconductor chip, for example, on the p-type semiconductor layer, the internal mirror and/or the chip-internal separation of electrical potentials from the n- and p-side (so-called IDL=internal dielectric layer).

FIG. 3B differs from FIG. 3A in that the covalent bonding of the Si—O units to the aluminum atoms Al of the aluminum oxide of the dielectric layer 1 is shown. A covalent structural unit Al—O—Si is formed as a surface termination. Preferably, the oxygen groups between the silicon atoms that are not bonded to the aluminum surface can additionally covalently bind to one another.

Compared to the radiation-emitting components 100 of FIGS. 3A and 3B, FIG. 3C has an additional second protective layer 3. The second protective layer 3 is arranged directly on the first protective layer 2. The dielectric layer 1 is preferably made of aluminum oxide, the first protective layer 2 is formed from silicon oxide and the second protective layer 3 is formed from silicon.

The second protective layer 3 has, in particular, a layer thickness of approximately 1 nm.

FIGS. 4A to 4C show a method of producing a radiation-emitting component 100 according to an example. The radiation-emitting component 100 has a dielectric layer 1 on which a particle, for example, a dirt particle 8, is arranged. The particle 8 can, for example, be applied to the dielectric layer 1 as a result of dust during production. A first protective layer 2 made in particular of silicon oxide, is arranged above the dielectric layer 1 and the particle 8, and thus encapsulates, on the one hand, the dielectric layer 1 and the particles 8 on the first protective layer 2. A second protective layer 3, in particular made of silicon, can be applied on the first protective layer 2, the second protective layer 3 encapsulates the first protective layer 2, the dielectric layer 1 and the particles 8.

As a result of shear forces 9, the particle 8 can flake off from the surface of the dielectric layer 1 so that the surface 7 of the dielectric layer 1 can be exposed. Since the dielectric layer 1 degrades under environmental influences, now the second protective layer 3 moves because of diffusion 5 onto the surface of the dielectric layer 1 and the so-called wound healing or self-healing of the first protective layer 2 takes place.

In FIG. 4C, the healing by chemical reaction of the silicic acid can be seen on the surface of the dielectric layer 1, wherein subsequently a covalent bonding of the silicic acid to the dielectric layer 1 is carried out. In this way, the degradation-sensitive dielectric layer 1 can be passivated automatically, and so-called errors such as pinholes, scratches or process errors, are automatically healed when the radiation-emitting component is exposed to a degrading environment, that is to say to environmental influences. Preferably, the silicon of the second protective layer 3 in the form of silicic acid or silicic acid residues can diffuse in a radius of, in particular, 1 µm to 100 µm, and thus can also automatically passivate spaced-apart errors of the dielectric layer 1 and/or open surfaces of the dielectric layer 1.

Figure 5A:
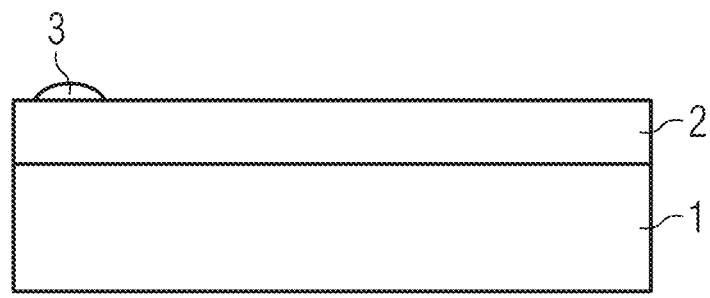
FIGS. 5A to 5C show a method of producing a radiation-emitting component.
Figure 5B:
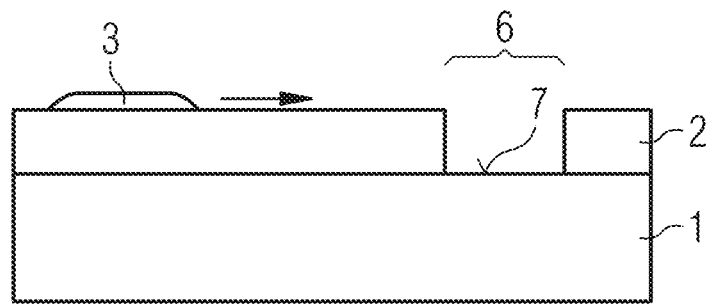
Figure 5C:
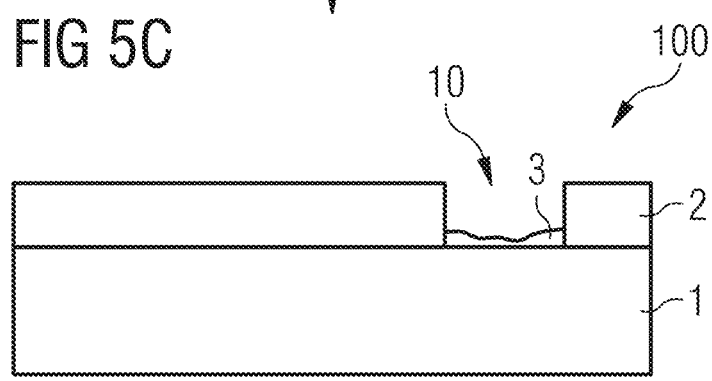

FIGS. 5A to 5C show a schematic side view of a radiation-emitting component 100 according to an example.

FIG. 5A shows a dielectric layer 1, for example, made of aluminum oxide, which is covered with a first protective layer 2 in a form-fitting manner. A second protective layer 3 is applied in a structured manner on the first protective layer 2, here formed, for example, as particles.

FIG. 5B shows that in the event of damage to the first protective layer 2 and, thus, in the event of exposure of the surface of the dielectric layer 1, the second protective layer 3, formed from silicon, is capable of migrating, that is to say of diffusing, in the direction of damage in the form of silicic acid, and onto the exposed surface of the dielectric layer 1 and covering the latter in a form-fitting manner so that degradation of the dielectric layer 1 is avoided. This process is also referred to as a passivation process of the dielectric layer 1 or as a self-healing process of the protective layer 2 as shown in FIG. 5C.

In other words, the silicon of the second protective layer 3 reacts as shown in FIG. 5A to silicic acid or silicic acid residues as shown in FIG. 5B and is bound to aluminum oxide as silicon oxide as shown in FIG. 5C.

Figure 6A:
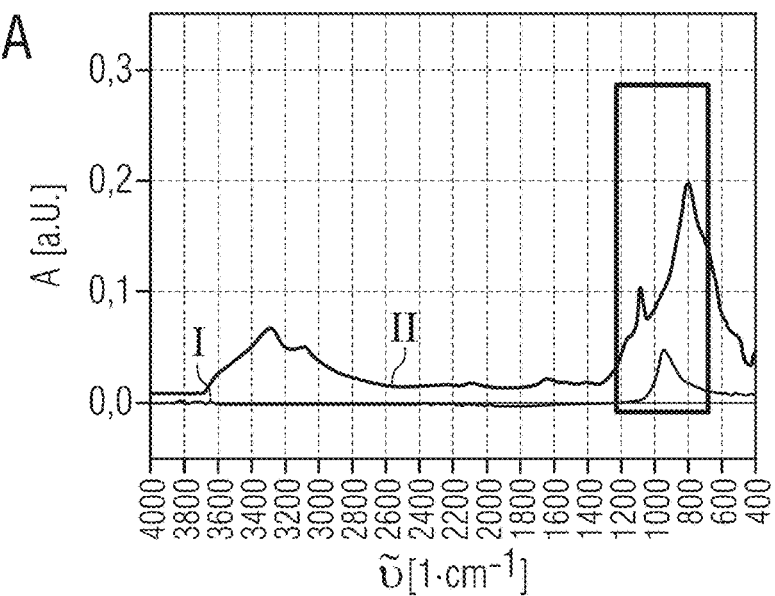
FIGS. 6A to 6C each show an FTIR spectrum according to an example.
Figure 6B:
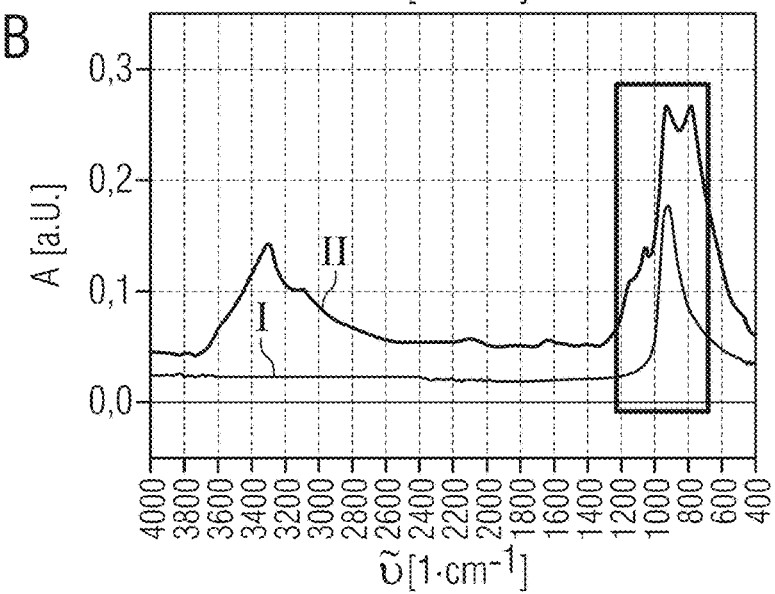
Figure 6C:
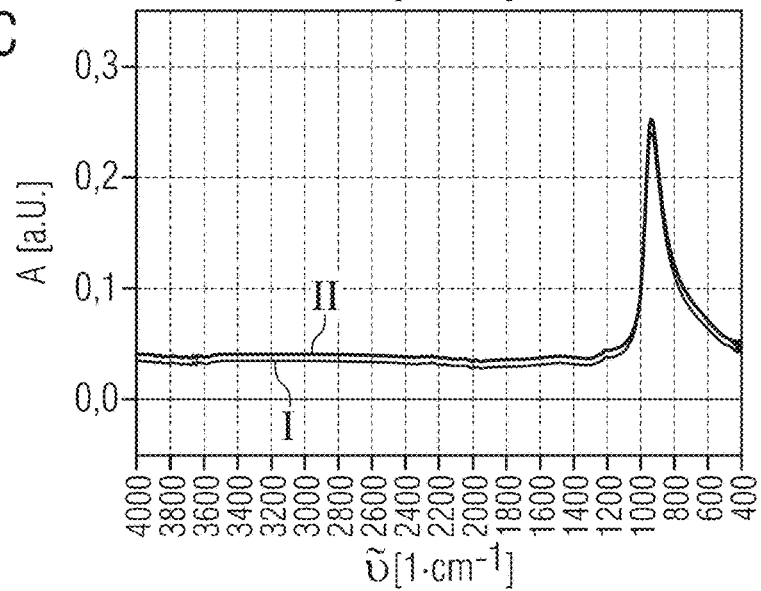

FIGS. 6A to 6C each show an FTIR spectrum according to an example. In each case, the absorption A is represented in arbitrary units (a.u.) as a function of the wave number υ in $cm^{-1}$. Each spectrum I shows the dielectric layer 1 prior to ageing, and each spectrum II shows the dielectric layer after ageing. FIG. 6A shows the dielectric layer 1, wherein no protective layer 2, 3 is arranged on the dielectric layer 1. FIG. 6B shows application of a first protective layer 2 produced by an ALD cycle, and FIG. 6C shows the dielectric layer 1 with a first protective layer 2 generated by three ALD cycles. The first protective layer 2 is preferably formed from silicon oxide. The first protective layer 2 can be produced directly after application of the dielectric layer 1, that is to say with the same ALD system. Only the precursor was changed.

The first protective layer 2 terminates the surface of the aluminum oxide of the dielectric layer 1 by Al—O—Si compounds. Experiments have shown that this surface termination is sufficient to render the aluminum oxide of the dielectric layer 1 stable. In particular, three ALD cycles are sufficient to produce the first protective layer 2 of silicon dioxide to render the dielectric layer 1 stable against degradation since, as a rule, no monolayer, in particular no closed monolayer, can be produced with an ALD cycle depending on the installation and on the process. 15 to 20 ALD cycles correspond to a layer thickness of approximately 1 nm.

The first protective layer 2 formed is thus subnanometer thick. Basically, deposition of one monolayer of the first protective layer 2 is sufficient. The advantage of the first protective layer 2 is that it can be generated directly following deposition of the dielectric layer 1. The first protective layer 2 can cover and chemically terminate all regions of the dielectric layer 1 without the need for a system change or the like.

In addition to the first protective layer 2, a second protective layer 3 made of silicon can be applied. In particular, the thickness of the second protective layer is at most 3 nm or at most 1.5 nm, for example, 1 nm. The second protective layer 3 shows a self-activated passivation mechanism. Normally, the silicon of the second protective layer 3 rests. In a degrading environment, for example, at high humidity or temperature, a chemical surface mechanism is triggered in an exposed dielectric material 1, for example, aluminum oxide. Silicic acid and silicic acid residues are formed and precipitate on the surface of the dielectric layer 1 due to surface-chemical processes and terminate the surface with Al—O—Si bonds. A type of silicon oxide film is automatically formed on the previously exposed surface of the dielectric layer 1. This effect has a certain remote action, for example, a distance between the damage and the first or second protective layer 2, 3 made of silicon can be greater than 100 µm. This distance leads to the fact that also exposed surfaces of the dielectric layer 1 that lie at some distance from the protective layer 2, 3 made of silicon can be passivated.

The examples described in conjunction with the figures and the features thereof can also be combined with one another in accordance with further examples, even if such combinations are not explicitly shown in the figures. Furthermore, the examples described in conjunction with the figures can have additional or alternative features according to the description of the general part.

My components and methods are not restricted to the examples by the description on the basis of the examples. Rather, this disclosure encompasses any new feature and also any combination of features, which includes in particular combinations of features in the appended claims, even if the feature or combination itself is not explicitly specified in the claims or examples.

This application claims priority of DE 10 2016 109 874.4, the subject matter of which is incorporated herein by reference.

The invention claimed is:

1. A method of producing a radiation-emitting component comprising:
  A) providing a dielectric layer that degrades against environmental influences,
  B) applying a first protective layer to the dielectric layer by an atomic layer deposition method,
  wherein the first protective layer comprises elemental Si or in a compound, and
  C) applying a second protective layer to the first protective layer, the second protective layer comprising elemental Si,
  wherein a layer thickness of the first protective layer is less than or equal to 1 nm so that the first protective layer reduces or prevents a degradation of the dielectric layer, and
  in the event of damage to at least one of the first protective and the dielectric layer, the second protective layer automatically heals damage of the at least one of the first protective layer and the dielectric layer.

2. The method according to claim 1, wherein the dielectric layer comprises aluminum, and
after step B), a covalent bonding of the first protective layer to the dielectric layer is present including covalent bonds Al—O—Si.

3. The method according to claim 1, wherein the layer thickness of the first protective layer is exactly one monolayer.

4. The method according to claim 1, wherein, in the event of damage to the first protective layer and exposing the dielectric layer, the first protective layer heals damage in a self-healing manner so that the dielectric layer is passivated with respect to environmental influences without further process steps.

5. The method according to claim 4, wherein the healing is carried out by chemical reaction of the Si of the first protective layer to silicic acid or derivatives thereof and, subsequently, a covalent bonding of the silicic acid to the dielectric layer occurs comprising a covalent bond Al—O—Si.

6. The method according to claim 1, wherein the first protective layer covers the dielectric layer in a form-fitting manner.

7. The method according to claim 1, wherein the dielectric layer comprises aluminum oxide and is produced by an atomic layer deposition method.

8. The method according to claim 1, wherein the first protective layer comprises silicon oxide, and
the first protective layer covers the dielectric layer in a form-fitting manner.

9. The method according to claim 1, wherein the second protective layer has a layer thickness of at most 1.5 nm.

10. The method according to claim 1, wherein the healing is carried out by chemical reaction of the Si of the second protective layer to silicic acid or derivatives thereof and, subsequently, a covalent bonding of the silicic acid to the dielectric layer occurs according to structural formula Al—O—Si.

11. The method according to claim 10, wherein the second protective layer and the damage have a distance of at least 1 µm and of at most 200 µm and, in the event of the healing, the second protective layer diffuses in the direction towards the damage and the dielectric layer is passivated.

12. The method according to claim 1, wherein the second protective layer is applied such that the dielectric layer and/or the first protective layer is/are not covered in a formfitting manner.

13. A radiation-emitting component comprising
a dielectric layer comprising aluminum oxide, and
a first protective layer arranged on the dielectric layer and configured to encapsulate the dielectric layer against environmental influences,
wherein at least one of the dielectric layer and the first protective layer is produced by an atomic layer deposition method,
the first protective layer comprises elemental Si or in a compound,
a layer thickness of the first protective layer is less than or equal to 1 nm so that the first protective layer reduces or prevents a degradation of the dielectric layer,
a second protective layer is applied to the first protective layer and the second protective layer comprises elemental Si, and
in the event of damage to at least one of the first protective layer and the dielectric layer, the second protective layer automatically heals damage of the at least one of the first protective layer and the dielectric layer.

14. The radiation-emitting component according to claim 13, which is an organic light-emitting diode, an inorganic light-emitting diode or a laser.

15. A method of producing a radiation-emitting component comprising:
A) providing a dielectric layer that degrades against environmental influences, and
B) applying a first protective layer to the dielectric layer by an atomic layer deposition method,
wherein the first protective layer comprises elemental Si,
a layer thickness of the first protective layer is less than or equal to 1 nm so that the first protective layer reduces or prevents degradation of the dielectric layer, and
in the event of damage to the first protective layer and exposing the dielectric layer, the first protective layer heals damage in a self-healing manner so that the dielectric layer is passivated with respect to environmental influences without further process steps.

* * * * *